(12) United States Patent
Narayanan et al.

(10) Patent No.: US 7,710,101 B2
(45) Date of Patent: May 4, 2010

(54) METHOD AND SYSTEM FOR MEASURING MAXIMUM OPERATING FREQUENCY AND CORRESPONDING DUTY CYCLE FOR AN I/O CELL

(75) Inventors: Vijayaraghavan Narayanan, Motia Khan (IN); Balwant Singh, Greater Noida (IN)

(73) Assignee: STMicroelectronics Pvt. Ltd., Greater Noida (UP) (IN)

( * ) Notice: Subject to any disclaimer, the term of this patent is extended or adjusted under 35 U.S.C. 154(b) by 256 days.

(21) Appl. No.: 11/833,779

(22) Filed: Aug. 3, 2007

(65) Prior Publication Data

US 2008/0030186 A1 Feb. 7, 2008

(30) Foreign Application Priority Data

Aug. 4, 2006 (IN) .................................. 1785/2006

(51) Int. Cl.
*G06F 1/12* (2006.01)
*G06F 1/04* (2006.01)

(52) U.S. Cl. ..................... 324/76.39; 713/400; 713/600

(58) Field of Classification Search .............. 324/76.39; 713/400–600

See application file for complete search history.

(56) References Cited

U.S. PATENT DOCUMENTS

| 5,231,598 | A * | 7/1993 | Vlahos ........................ 714/700 |
| 6,552,578 | B1 * | 4/2003 | Cheung et al. ................. 327/26 |
| 6,750,692 | B2 * | 6/2004 | Jang ............................ 327/291 |
| 6,960,952 | B2 * | 11/2005 | Nguyen et al. ............... 327/175 |
| 2002/0070752 | A1 * | 6/2002 | Harrison ....................... 326/29 |
| 2003/0117868 | A1 | 6/2003 | Singh | |

* cited by examiner

*Primary Examiner*—Timothy J Dole
*Assistant Examiner*—Farhana Hoque
(74) *Attorney, Agent, or Firm*—Hogan & Hartson LLP

(57) ABSTRACT

A circuit for measuring maximum operating frequency and its corresponding duty cycle for an input I/O cell implementation under test (IUT) includes a condition checking module, a central control module and a duty cycle measurement module. The condition checking module checks an upper threshold voltage and a lower threshold voltage. The central control module controls a plurality of operations for measuring the frequency. The duty cycle measurement module measures the duty cycle and finally all these modules together and calculates maximum operating frequency of the IUT.

6 Claims, 9 Drawing Sheets

METHOD AND SYSTEM FOR MEASURING MAXIMUM OPERATING FREQUENCY AND CORRESPONDING DUTY CYCLE FOR AN I/O CELL

RELATED APPLICATION

The present application claims priority to India Patent Application No. 1785/Del/2006 filed Aug. 4, 2006, which is incorporated herein in its entirety by this reference.

FIELD OF THE INVENTION

The present invention relates to electronic circuits, and more specifically to a system and method for measuring a maximum operating frequency, and its corresponding duty cycle for an I/O cell inside a chip.

BACKGROUND OF THE INVENTION

There are various parameters, such as operating frequencies, duty cycle, or potential drop measurements at different nodes inside an integrated circuit, which needs to be analyzed. These parameters are required to understand special characteristics of the Integrated Circuits (ICs). A specific value of an operating frequency and a duty cycle of an on chip clock or signal often become significant in very large scale integration (VLSI), like DRAM circuits and analog to digital conveter (ADC) circuits, which are sensitive to the operating frequency or duty cycle or where operations are synchronized with both transitions of the clock.

There exist many applications where the speed of the I/O structures becomes a limiting factor inside a chip. In such cases identifying the true limits of the operating frequency of the I/O structures with respect to a specified duty cycle and an upper and a lower voltage threshold limit can help the core designer, as he/she exactly knows the limiting frequency of I/Os for applying critical signals like clock and observing the output values. Identifying the true operating frequency in a computer system may prevent inconsistencies between the processor, software running on it, and the generation of operation-code exceptions.

The clock signal is a heart beat for all synchronous digital computing and communication circuits, some of which are sensitive to both edges of the clock. Dynamic and domino logic circuits require one phase of the clock cycle for precharge and the other to evaluate, thus imposing a tight constraint on the operating frequency and the duty cycle of the clock to operate at maximum possible speed. In data communication circuits and systems the importance of clock-to-data correlation is magnified, and large variations in these parameters (operating frequency and duty cycle) of the clock cannot be tolerated. Similarly, in serializer/deserializer (SERDES) technology when both edges of the serialization signal are used to serialize the data, a balanced duty cycle becomes very important to provide equal transmission time for each symbol.

In advanced deep submicron VLSI technologies, the clock is distributed to individual components through a large clock distribution tree made up of clock buffers and interconnects of appropriate sizes to minimize skew and end-to-end delay. A noticeable degradation in duty cycle can be observed at the terminal ends of the signal distribution network, even for signals generated with a perfectly stable and accurate signal source. This is due to a slight mismatch in the drive strengths of pull-up and pull-down networks of the CMOS gates/buffers and non-uniformity in the distribution of wiring capacitance. A local duty cycle correction circuit is usually required to fix this problem.

At the tester level, operating frequency measurement can be done only for output I/Os, not for input I/Os. Hence an on chip system is required which would internally measure the operating frequency of an input I/O and generate the result in a digital format.

There exists various conventional techniques for frequency measurement inside a chip, but none of the techniques provide measurement of the true operating frequency, which satisfies a plurality of conditions, such as duty cycle values, upper voltage threshold and lower voltage threshold.

Therefore, there arises a need for a testing methodology for measuring maximum operating frequency and corresponding duty cycle for an input, and output I/O cell. Moreover, the proposed methodology provides an on chip testing flexibility.

SUMMARY OF THE INVENTION

It is an object of the present invention to provide a flexible methodology utilizing a simple and cost effective circuit for measuring a maximum operating frequency, and its corresponding duty cycle for an input I/O cell.

To achieve the aforementioned objectives, the present invention provides a circuit for measuring a maximum operating frequency, and its corresponding duty cycle variation of an input implementation under test (IUT). The circuit includes
- a condition checking module for checking an upper threshold voltage and a lower threshold voltage,
- a central control module for controlling a plurality of operations for measuring the frequency, and
- a duty cycle measurement module for calculating the duty cycle of the input IUT.

Further, the present invention provides a circuit for on-chip measurement of maximum operating frequency of an input IUT, said frequency obeying a plurality of conditions at a maximum frequency, with the circuit being synchronized with a central controller for a proper handshaking. The circuit includes
- an input I/O (IUT) terminal for receiving an input voltage signal, the terminal including:
- a count register connected to the central controller for storing a number of cycles for which a sample test is performed,
- a plurality of programmable loads for determining a maximum frequency at a plurality of loads,
- a programmable voltage threshold sensor calibrated at an upper threshold limit and a lower threshold limit for analyzing an output voltage signal from the IUT terminal for a desired threshold voltage level,
- a ripple counter connected to the voltage threshold sensor for counting passed output voltage signals from the voltage sensor, with the passed output voltage signals obeying the desired threshold voltage level,
- a time to digital converter (TDC) receiving the output voltage signal from the IUT terminal for converting a width of the output voltage signal to a binary equivalent value, and
- an accumulator connected to the TDC for adding a binary value of the output voltage signal for the number of cycle,
- the plurality of conditions including:
- a signal transition at an IUT output for a low pulse crossing a specified lower voltage threshold limit;

a signal transition at an IUT output for a high pulse crossing a specified upper voltage threshold limit; and a duty cycle at an I/O output remains within a specified limit.

The present invention also provides a method for measuring a maximum operating frequency and its corresponding duty cycle variation of an I/O cell, including the following steps:

checking a set of conditions for an I/O cell;

calculating a duty cycle value; and calculating the maximum operating frequency for the I/O cell.

Further the present invention provides a method for measuring a maximum operating frequency, and its corresponding duty cycle variation of an input I/O cell, which includes the steps of:

calibrating a time to digital converter (TDC) to formulate a binary to time domain conversion (BTDC) formula;

calibrating a programmable voltage threshold sensor for an upper voltage threshold value and a lower voltage threshold value;

storing a sample test cycle number(N) through a count register;

applying N input cycles having a high pulse width (HPW) less than a low pulse width (LPW);

shifting out accumulator contents to measure a duty cycle;

shifting out ripple counter contents for checking, if said input cycles crosses an upper threshold voltage;

checking a ripple count value, and a duty cycle value;

decreasing the HPW when the ripple counter value equals N and the duty cycle value is within a specification;

storing a last passed high pulse width value, when the ripple counter value is not equal to N and the duty cycle value is not within the specification;

applying N input cycles having a high pulse width HPW>LPW;

shifting out accumulator contents to measure a duty cycle;

shifting out the ripple counter contents for checking, if the input cycles crosses a lower threshold voltage;

checking a ripple count value, and a duty cycle value;

decreasing the LPW when the ripple counter value equals N and the duty cycle value is within a specification;

storing a last passed low pulse width value, when the ripple counter value is not equal to N, and the duty cycle value is not within the specification; and calculating a maximum frequency from said passed low pulse width value, and a passed high pulse width value.

DETAILED DESCRIPTION OF THE INVENTION

The present invention provides a circuit for measuring a maximum operating frequency, and its corresponding duty cycle for an input I/O cell inside a chip circuit.

Figure 1:
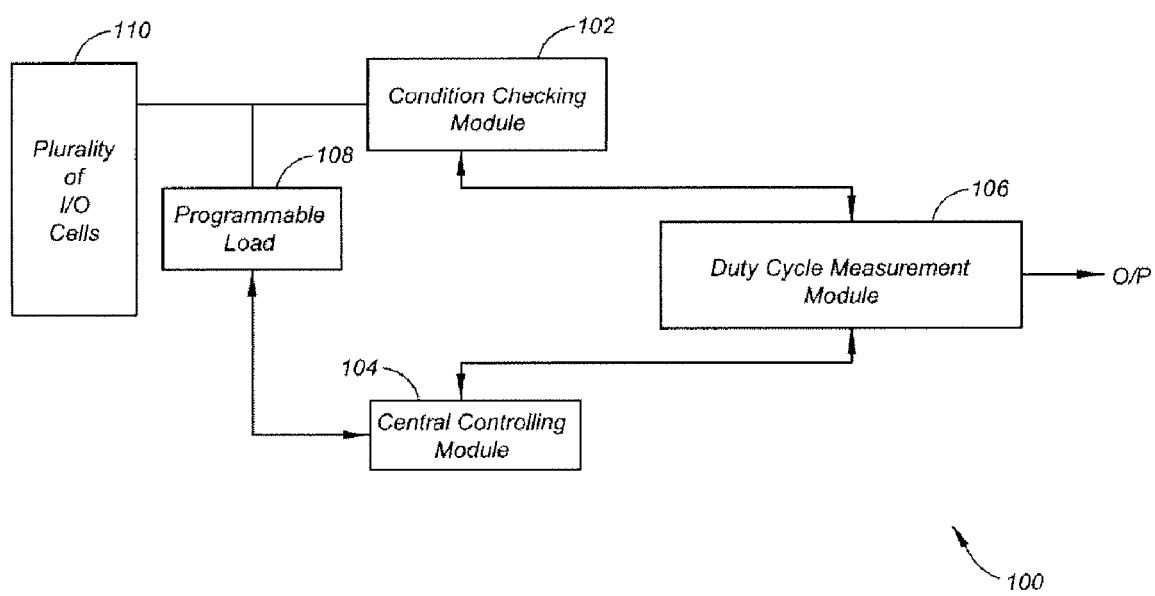
FIG. 1 illustrates a block diagram of a system for measuring a maximum operating frequency and its corresponding duty cycle in an Input I/O cell according to the present invention.

FIG. 1 illustrates a block diagram of a system for measuring a maximum operating frequency and its corresponding duty cycle in an Input I/O cell according to the present invention. The system 100 includes a condition checking module 102, a central control module 104, and a duty cycle measurement module 106. The system 100 further includes a programmable load module 108. The condition checking module 102 checks an upper threshold voltage and a lower threshold voltage. The central control module 104 controls a plurality of operations for measuring the frequency. The duty cycle measurement module 106 measures the duty cycle and finally all these modules 102, 104, and 106 together calculates maximum operating frequency of the Input I/O cell.

Figure 2:
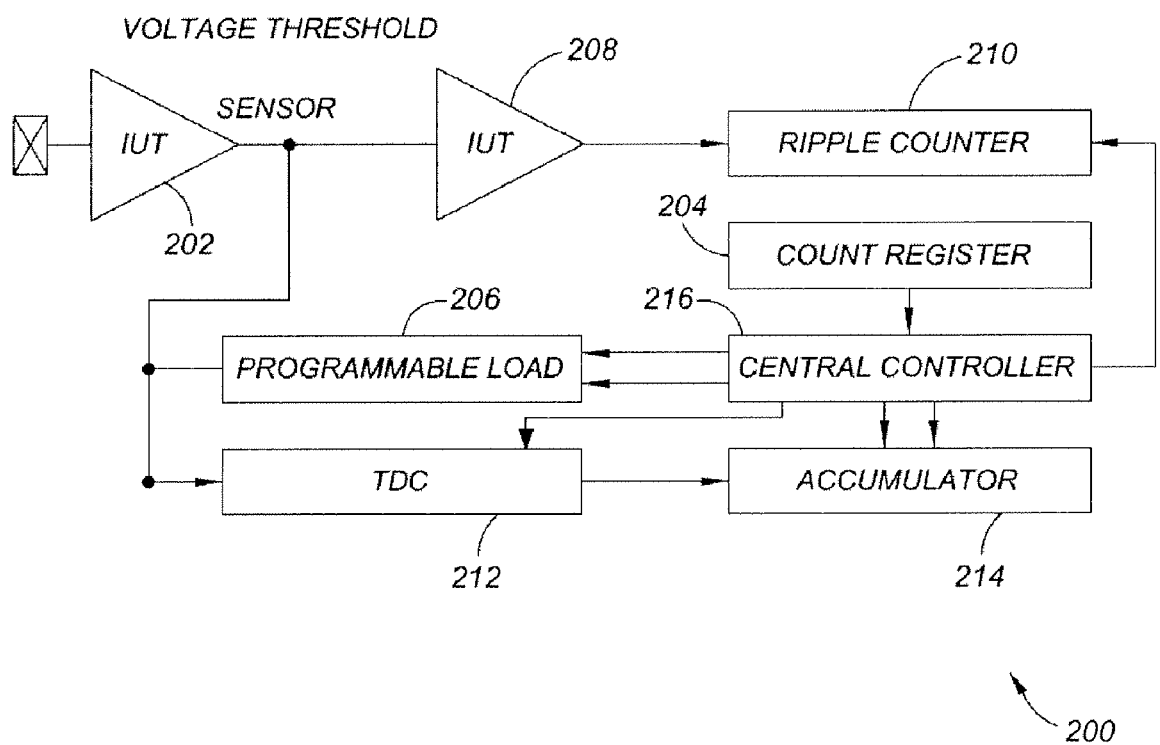
FIG. 2 illustrates a schematic block diagram of a circuit for measuring a maximum operating frequency and its corresponding duty cycle in an Input I/O cell according to a preferred embodiment of the present invention.

FIG. 2 illustrates a schematic block diagram of a circuit 200 for measuring a maximum operating frequency and its corresponding duty cycle in an input I/O cell according to a preferred embodiment of the present invention. The circuit 200 includes an IUT terminal 202, a count register 204, a programmable load 206, a programmable voltage threshold sensor 208, a ripple counter 210, a time-to-digital converter (TDC) 212, and an accumulator 214. All blocks in the circuit 200 may receive their control inputs either from a central controller 216, or directly from primary inputs (Pad).

An I/O's maximum operating frequency, is the highest frequency which satisfies all the following three conditions:

The signal transition at the output of the I/O for a low pulse crosses the specified lower voltage threshold limits (usually 10% of supply voltage (vdd)).

The signal transition at the output of the I/O for a high pulse crosses the specified upper voltage threshold limits (usually 90% of supply voltage).

The Duty Cycle at the output of the I/O remains within specified limits (usually a 40:60 or 60:40 duty cycle is the permissible limit for an input duty cycle of 50:50).

The maximum operating frequency is determined by applying 'N' number of cycles at an input of the IUT terminal 202 and determining whether in all those 'N' cycles each of the above condition is met or not. As seen from FIG. 2, the count register 204 stores the number of cycles for which a test is to be run and a set of the programmable loads 206 are also present to determine a maximum frequency at various loads.

The programmable voltage threshold sensor 208 has been implemented to determine whether an output of the IUT terminal 202 reaches the desired voltage threshold levels. The voltage threshold sensor 208 is calibrated with its upper & lower thresholds frequency limits (say 10% & 90% of Vdd). In other embodiments different limits can be set for the upper and lower threshold limits depending on the tests. Thus, before the actual test starts, we calibrate the programmable voltage threshold sensor to a desired upper voltage threshold level and a lower voltage threshold level. The output of the voltage threshold sensor 208 is fed to the ripple counter 210. Thus if we apply 1000 input cycles and in all those 1000 cycles the output of the I/O crosses the specified threshold limits, then the ripple counter 210 will count up to 1000.

Now it is required to be seen whether over those 1000 cycles, the duty cycle remains within specified limits (40:60 or 60:40). Suppose, we apply an input frequency of 10 MHz (100 ns) with a duty cycle of 50:50 at the input of the IUT terminal 202, then at the output, we might get a signal whose duty cycle is different from the input duty cycle. This implies that over a cycle a high pulse of 50 ns at the input should come out through the output with a width greater than 40 ns and less than 60 ns. The output of the IUT terminal 202 is first fed to the TDC 212. The TDC circuit converts an input pulse into its binary equivalent value. This binary value is then converted to a time-domain value using a Time Domain Conversion (BTDC) formula. This time-domain value is equal to the width of the Input pulse fed to the TDC. Although many implementations of Time to are available and can be used, the one implemented Digital converters for this application is derived from a technique described in U.S. Patent Application Publication No. No. 20030117868 entitled Measurement Of Timing Skew Between Two Digital Signals. The working details of this time to digital converter (TDC) can be found in above mentioned patent application. A binary value equivalent of a high pulse width time obtained from the TDC 212 is then added up in the accumulator 214, which adds all these binary values over a given number of input cycles. Thus, if we apply 1000 input cycles, the TDC will convert the 1000 high pulse widths to a binary format, which would get added up in the accumulator 214. The final accumulator value will now represent a sum of high pulse width times over 1000 cycles. This binary value is then converted back to time format by using a Binary to Time Domain Conversion (BTDC) formula for the TDC 212. The details of BTDC formula can also be found in U.S. Patent Application Publication 20030117868. This final value when divided by a number of applied cycles (1000) gives an average value of a high pulse width. Now if this value is greater than 40 ns & less than 60 ns, then it can be said that the signal at the output of the IUT terminal 202 satisfies the permissible duty cycle (40:60/60:40) requirements.

Figure 3:
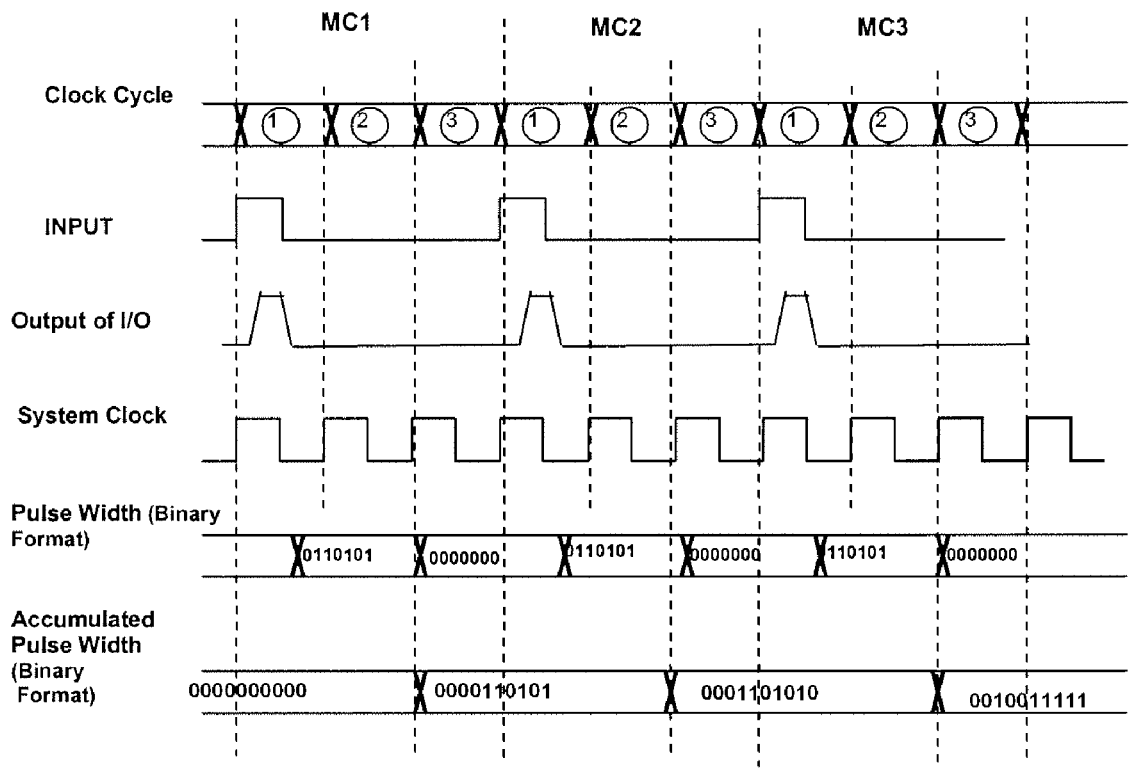
FIG. 3 is a waveform diagram illustrating a timing diagram for a duty cycle measurement according to the present invention.

To make the measurement procedure synchronous with a system clock, the whole methodology has been divided into 2 iterations. The idea is that instead of applying an input signal with 50:50 Duty Cycle, 2 sets of input signals are applied in different iterations, one in which a high pulse width is much less than a low pulse width and vice-versa. In both the cases the input cycle is kept, such that it corresponds to 3 cycles of a system clock (equal to 1 machine cycle—MC). The waveform corresponding to the first iteration is illustrated in FIG. 3 in which the input signal's high pulse width is much less than the low pulse width.

Figure 4:
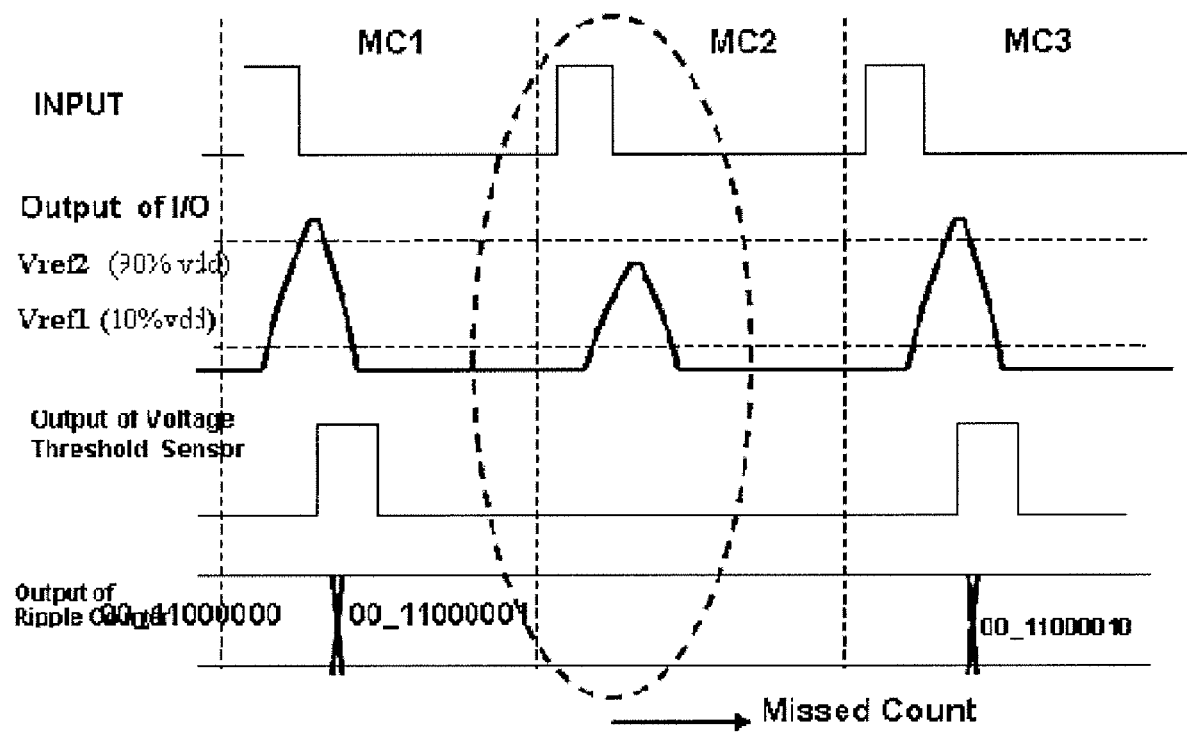
FIG. 4 is a waveform diagram illustrating upper threshold voltage detection according to the present invention.

The test is performed over say 1000 (loaded in the count register 204) such input cycles. In this iteration it is checked whether the input pulse has crossed 90% of the voltage threshold limit in all the cycles. This would be verified if the ripples counter 210 stores a count of 1000. If the count is less than 1000, then it can be judged that in some input cycles, the high pulse width did not cross 90% of the voltage threshold limit. This is illustrated in FIG. 4.

Apart from a voltage threshold, the high pulse width is also continuously measured for each input cycle. This high pulse width is converted to a binary format by the TDC 212 which is then accumulated in the accumulator 214 during each machine cycle. To enable this operation, each machine cycle is made up of 3 system clock cycles (SCC) as illustrated in FIG. 3. In SCC-1, an input pulse is applied and it is measured by the TDC 212 and converted into the binary data format. In SCC-2, the binary data format gets added to the accumulator 214 and finally in SCC-3, the TDC 212 is reset to measure a next pulse (which arrives in the next machine cycle). Thus at the end of 1000 cycles, an accumulator value is shifted out (say via TDO port of the IEEE1149.1 JTAG logic). This binary value is converted into a real time value and then divided by 1000 to get an average pulse width during the 1000 input cycles.

Now a duty cycle can be calculated by taking up an example. Suppose that the applied pulse width was of 50 ns and the average actual pulse width inside the core came out to be 40 ns, then we can say that assuming that this applied pulse width was like a frequency of 100 ns period & 50:50 duty cycles, then the average duty cycle obtained inside the chip is 40:60.

Figure 5:
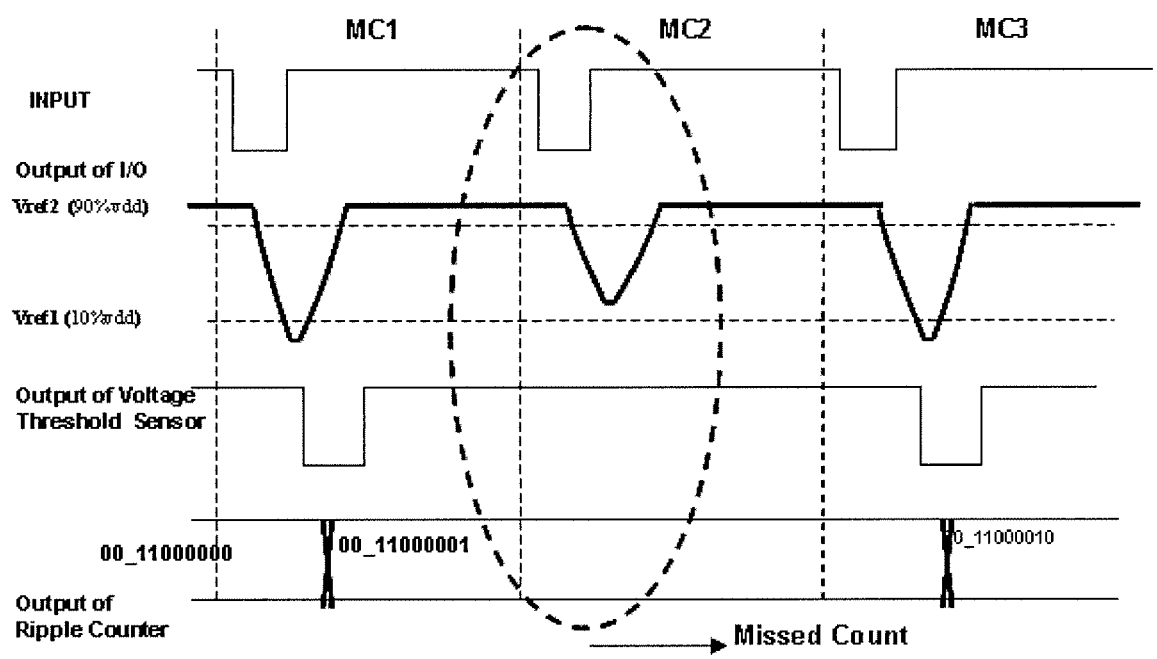
FIG. 5 is a waveform diagram illustrating lower threshold voltage detection according to the present invention.

The above mentioned procedure is repeated in the second iteration with low pulse width much less than the high pulse width. This is illustrated in the FIG. 5. At the end of this iteration, the contents of the ripple counter 210 needs to be checked. If the counter 210 has counted correctly till 1000, then it verifies that in each input cycle, the low pulse has crossed the 10% voltage threshold limit, if not the count would have been less than 1000.

Also, in this case the duty cycle is calculated in similar fashion as compared to the previous iteration. The duty cycle values in both iterations would come out to be the same. i.e. continuing the previous example of an input cycle of 100 ns with 50:50 duty cycle, the average measured pulse width in this case would come out to be 60 ns. Thus overall we can say that the average duty cycle in the chip is 40:60 for an input frequency having 50:50 duty cycles.

The measurement procedure is started by applying relaxed high pulse widths and low pulse widths (obtained from CAD simulations) respectively. Now this whole measurement methodology is repeated by decreasing the high pulse width in the first iteration and the low pulse width in the second iteration till we obtain a result beyond which we start getting results which violate the required specifications (i.e. either the high pulse width doesn't go till 90% Vdd or the low pulse width doesn't go till 10% vdd or the duty cycle deteriorates below 40:60 mark). Let 'Thpw' be the Last High Pulse Width value that passed, and let 'Tlpw' be the Last Low Pulse Width value that passed. Now a maximum operating frequency of an IUT is given by:

Maximum Frequency=1/[Worst of {Thpw; Tlpw}]*2

The above mentioned circuitry could be easily extended for a maximum frequency measurement of output I/Os as well.

Figure 6:
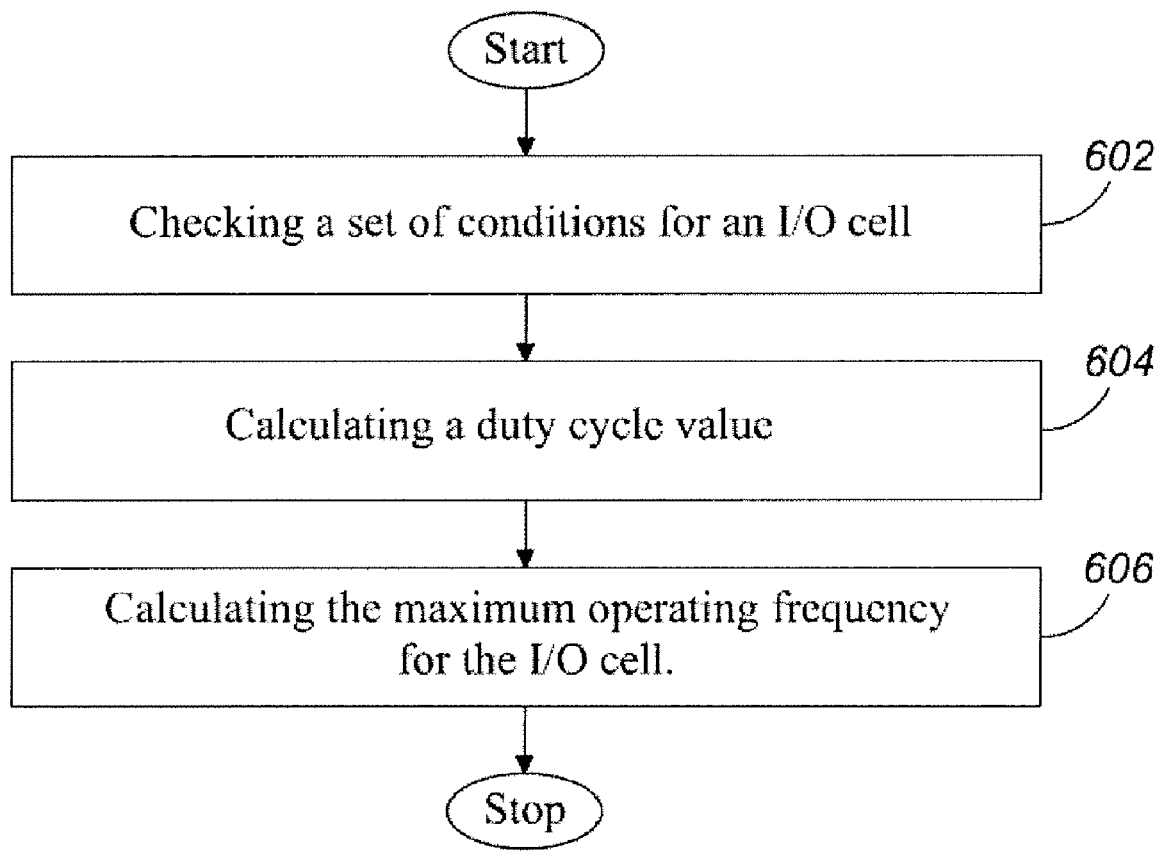
FIG. 6 illustrates a flow diagram of a method for measuring a maximum operating frequency, and its corresponding duty cycle variation of an input I/O cell according to the present invention.

FIG. 6 illustrates a flow diagram of a method for measuring a maximum operating frequency, and its corresponding duty cycle variation of an input I/O cell according to the present invention. At step 602, a set of conditions for an I/O are checked. At step 604, a duty cycle value is calculated. At step 606, a maximum operating frequency is calculated.

Figure 7A:
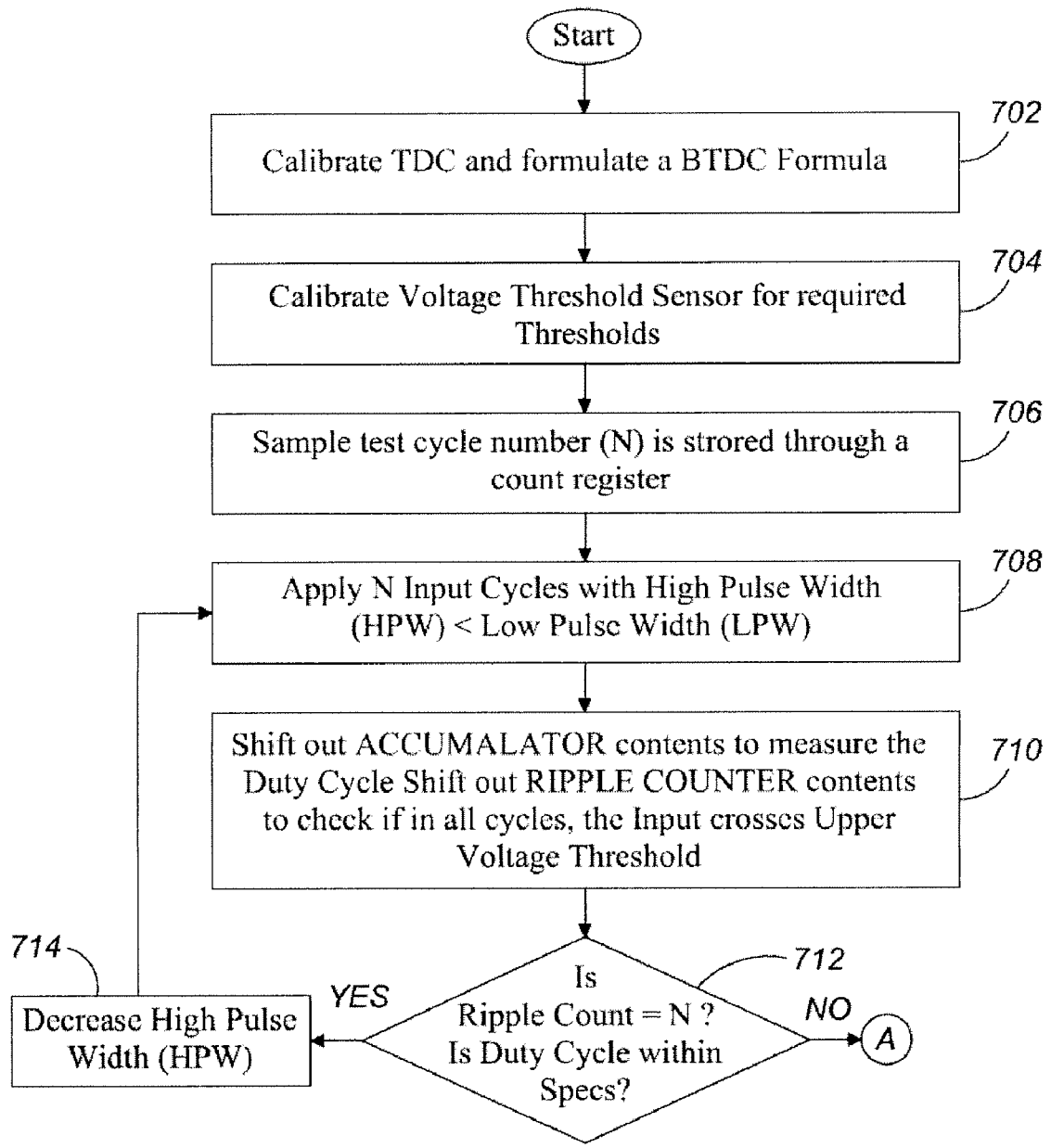
FIGS. 7A, 7B, and 7C illustrate a flow diagram of a method for measuring a maximum operating frequency, and its corresponding duty cycle variation of an input I/O cell according to a preferred embodiment of the present invention.
Figure 7B:
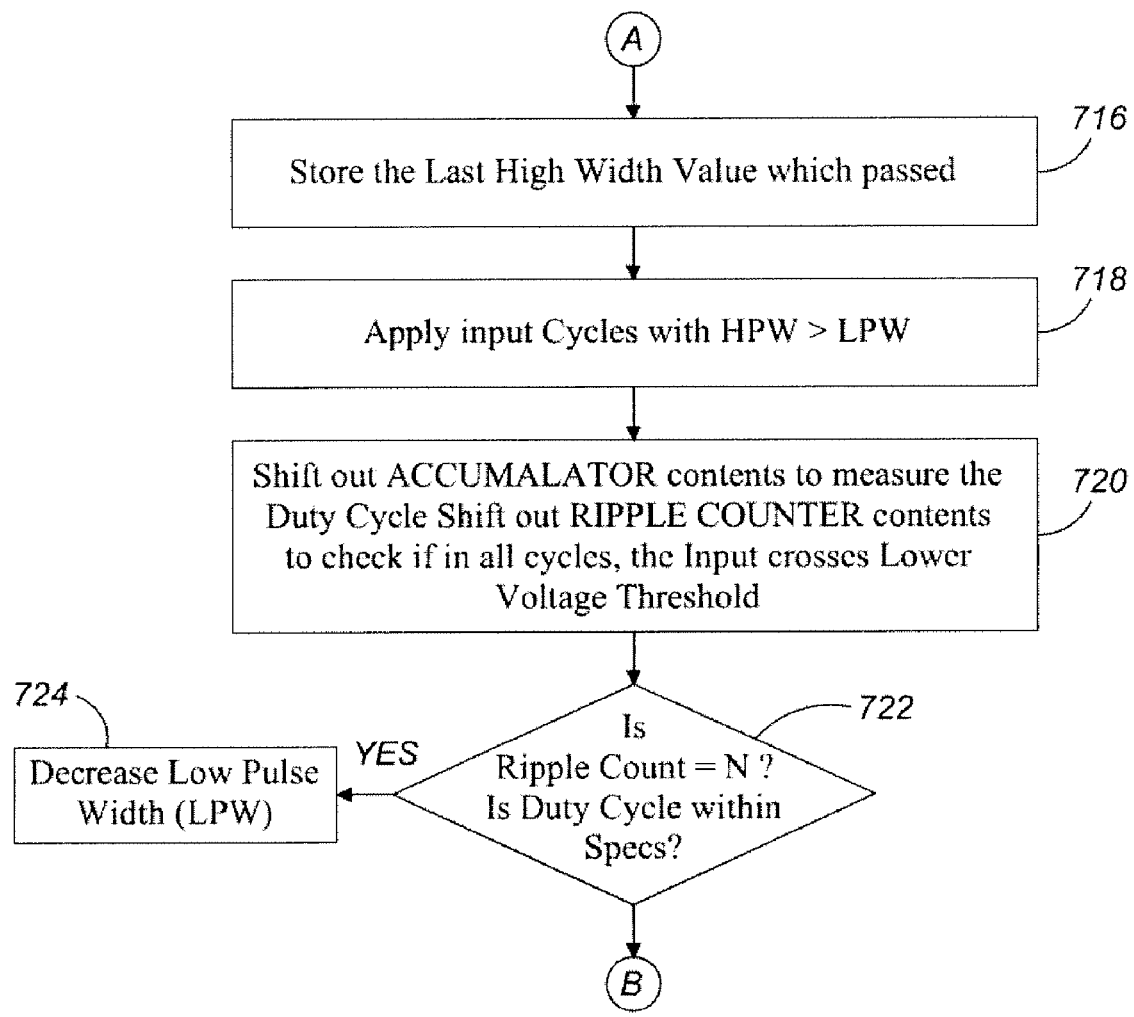
Figure 7C:
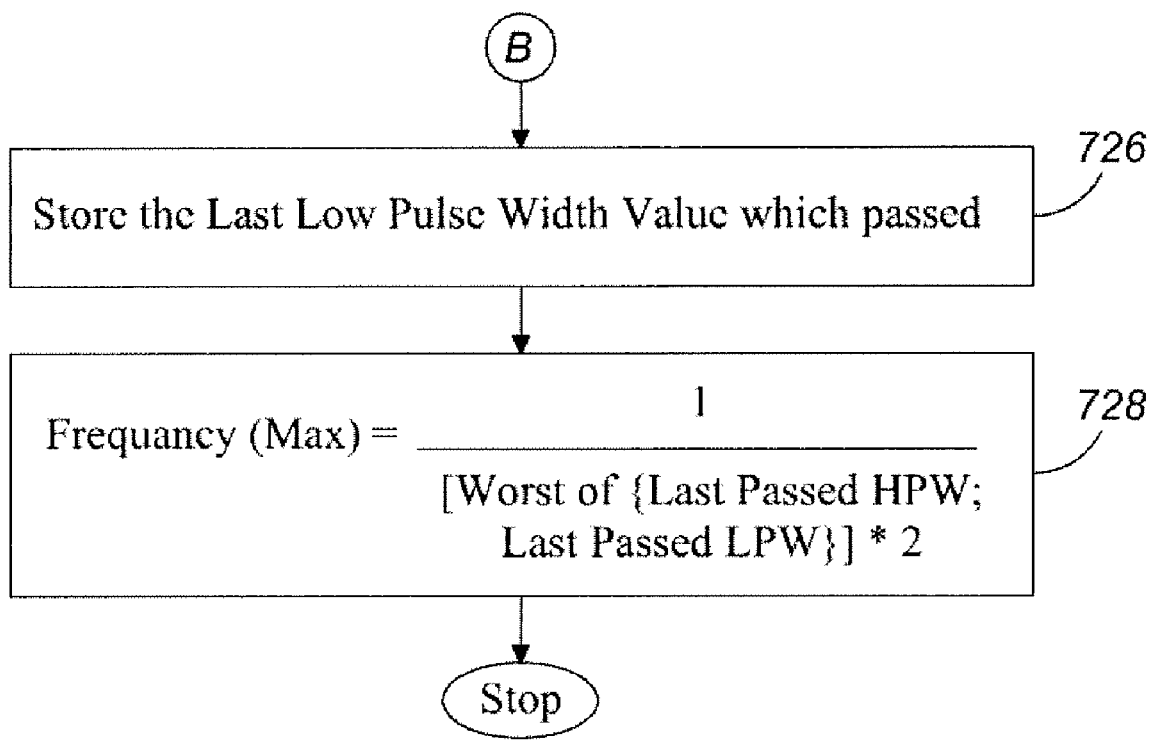

FIGS. 7A, 7B and 7C illustrates a flow diagram of a method for measuring a maximum operating frequency, and its corresponding duty cycle variation of an input I/O cell according to a preferred embodiment of the present invention. At step 702, a time to digital converter (TDC) is calibrated and a binary to time domain conversion formula (BTDC) is formulated. At step 704, a programmable voltage threshold sensor is calibrated for a desired threshold value. At step 706, sample test cycle numbers are stored through a count register. At step 708, N input cycles having high pulse width (HPW) less than low pulse width (LPW) are applied. At step 710, accumulator contents are shifted out to measure a duty cycle, and also ripple counter contents are shifted out for checking if in all cycles, the input crosses the upper threshold voltage. At step 712, a ripple count value and the duty cycle value are checked. At step 714, the high pulse width (HPW) is decreased, when the ripple counter value is N, and the duty cycle is within the specifications. At step 716, a last passed high pulse width value is stored, when the ripple counter value is not N, and the duty cycle is not within the specifications. At step 718, the input cycles having high pulse width (HPW) greater than the low pulse width (LPW) are applied. At step 720, accumulator contents are shifted out to measure a duty cycle, and also ripple counter contents are shifted out for checking if in all cycles, the input crosses the lower threshold voltage. At step 722, a ripple count value and the duty cycle value are checked. At step 724, the low pulse width (LPW) is decreased, when the ripple counter value is N, and the duty cycle is within the specifications. At step 726, a last passed low pulse width value is stored, when the ripple counter value is not N, and the duty cycle is not within the specifications. At step 728, a maximum operating frequency is calculated using a formula as shown in flow diagram.

The technique presented in the present invention offers many advantages. First the proposed circuit can be implemented with a simple and cost effective circuit. Second the proposed circuit having flexibility for an extension for measuring a maximum operating frequency, and its corresponding duty cycle for an output I/O cell as well as input I/O cell. Thirdly, as the circuit operates synchronously with a system clock, hence the circuit can be easily embedded with any controller logic.

We claim:

1. A circuit for on-chip measurement of a maximum operating frequency of an input implementation under test (IUT), said frequency obeying a plurality of conditions at a maximum frequency, said circuit being synchronized with a central controller for a proper handshaking, said circuit comprising:
   an input I/O IUT terminal for receiving an input voltage signal;
   a count register connected to the central controller for storing a number of cycles for which a sample test is performed;
   a plurality of programmable loads for determining a maximum frequency at a plurality of loads;
   a programmable voltage threshold sensor calibrated at an upper threshold limit and a lower threshold limit for analyzing an output voltage signal from said IUT terminal for a desired threshold voltage level;
   a ripple counter connected to said voltage threshold sensor for counting passed output voltage signals from said voltage sensor, the passed output voltage signals obeying the desired threshold voltage level;
   a time to digital converter (TDC) receiving the output voltage signal from said IUT terminal for converting a width of said output voltage signal to a binary equivalent value; and
   an accumulator connected to said TDC for adding a binary value of said output voltage signal for said number of cycles, said circuit utilizes a binary-to-time domain conversion formula for converting said binary value to a time domain value, said time domain value is divided by said cycles to calculate an average high pulse width value, wherein the plurality of conditions comprises:
   a signal transition at an IUT output for a low pulse crossing a specified lower voltage threshold limit;
   a signal transition at an IUT output for a high pulse crossing a specified upper voltage threshold limit; and
   a duty cycle at an I/O output remains within a specified limit.

2. A method for measuring a maximum operating frequency, and its corresponding duty cycle variation of an IUT, said method comprising:
   calibrating a time to digital converter to formulate a binary to time domain conversion formula;
   calibrating a programmable voltage threshold sensor for an upper voltage threshold value and a lower voltage threshold value;
   storing a sample test cycle number (N) through a count register;
   applying N input cycles having a high pulse width (HPW) less than a low pulse width (LPW);
   shifting out accumulator contents to measure a duty cycle;
   shifting out ripple counter contents for checking, if said input cycles crosses an upper threshold voltage; and
   checking a ripple count value, and a duty cycle value.

3. The method of claim 2 further comprising decreasing said HPW when the ripple counter value equals to N and the duty cycle value is within a specification.

4. The method of claim 2 further comprising:
   storing a last passed HPW value when the ripple counter value is not equal to N and the duty cycle value is not within the specification;
   applying N input cycles having an HPW>an LPW;
   shifting out the accumulator contents to measure a duty cycle;
   shifting out the ripple counter contents for checking, if said input cycles crosses a lower threshold voltage; and
   checking a ripple count value and a duty cycle value.

5. The method of claim 4 further comprising decreasing said LPW when the ripple counter value=N and the duty cycle value is within a specification.

6. The method of claim 4 further comprising:
   storing a last passed LPW value when the ripple counter value is not equal to N and the duty cycle value is not within the specification; and
   calculating said maximum frequency from said passed LPW value and a passed HPW value.

* * * * *